US009519028B2

United States Patent
Greenberg

(10) Patent No.: US 9,519,028 B2
(45) Date of Patent: Dec. 13, 2016

(54) METHOD AND SYSTEM FOR CHARACTERIZING BATTERY CELLS FOR USE IN BATTERY PACKS

(71) Applicant: The Boeing Company, Chicago, IL (US)

(72) Inventor: Melvin Barry Greenberg, Houston, TX (US)

(73) Assignee: The Boeing Company, Chicago, IL (US)

( * ) Notice: Subject to any disclaimer, the term of this patent is extended or adjusted under 35 U.S.C. 154(b) by 86 days.

(21) Appl. No.: 13/962,681

(22) Filed: Aug. 8, 2013

(65) Prior Publication Data

US 2015/0042351 A1   Feb. 12, 2015

(51) Int. Cl.
| | | |
|---|---|---|
| G01R 31/02 | (2006.01) | |
| G01R 31/36 | (2006.01) | |
| H01M 10/42 | (2006.01) | |
| H01M 10/0525 | (2010.01) | |

(52) U.S. Cl.
CPC ...... *G01R 31/3641* (2013.01); *H01M 10/4207* (2013.01); *H01M 10/0525* (2013.01); *Y10T 29/49108* (2015.01)

(58) Field of Classification Search
CPC ....................................................... H01M 2/00
USPC ............. 324/434–437; 320/106, 125; 429/49
See application file for complete search history.

(56) References Cited

U.S. PATENT DOCUMENTS

| | | | | |
|---|---|---|---|---|
| 4,746,852 | A | * | 5/1988 | Martin .......................... 320/106 |
| 5,780,992 | A | * | 7/1998 | Beard ................. H01M 2/1027 320/106 |
| 5,818,202 | A | * | 10/1998 | Miyamoto et al. ........... 320/125 |
| 2005/0099161 | A1 | * | 5/2005 | Sato ....................... H02J 7/0047 320/134 |
| 2010/0040939 | A1 | * | 2/2010 | Maegawa et al. ............... 429/49 |
| 2013/0214730 | A1 | * | 8/2013 | Lu ........................... H02J 7/007 320/107 |

* cited by examiner

*Primary Examiner* — Vincent Q Nguyen
(74) *Attorney, Agent, or Firm* — Kunzler Law Group, PC

(57) ABSTRACT

A system and method for use characterizing battery cells. Charging and/or discharging characteristics for each of a plurality of battery cells may be determined, the battery cells may be marked based on the determined charging and/or discharging characteristics, and grouped based on the marking—e.g., such as battery cells having similar or near similar charging and/or discharging characteristics are grouped together. Battery packs may then be assembled such that each battery pack would comprise only battery cells belonging to the same group (or "in-family"). The charging characterization may be based on voltage rise curve, which may be determined for each battery cell—e.g., based on sampling or recording during charging, at sufficient rate. Battery cells may subsequently be monitored, during use of the battery packs, to ensure that the charging or discharging does not change, and battery cells exhibiting change in characteristics may be manually or automatically removed from use.

19 Claims, 7 Drawing Sheets

METHOD AND SYSTEM FOR CHARACTERIZING BATTERY CELLS FOR USE IN BATTERY PACKS

FIELD

Certain embodiments of the disclosure relate to communications. More specifically, certain embodiments of the disclosure relate to an apparatus and method for characterizing battery cells for use in battery packs.

BACKGROUND

In many systems, electric power may be required to enable use and/or operation of the systems. In this regard, electric power may be required to drive system components (e.g., mechanical components, electronic components, or the like). The electric power may be obtained from external, dedicated power sources (e.g., power outlets, or dedicated power generators). Nonetheless, the power required to support system operations may not always be readily available—e.g., when connection to external and/or dedicated power sources may not be feasible, such as when the system is moving. For example, aircrafts or other airborne systems may require power while inflight, when connectivity to external electric power sources may not be feasible. Accordingly, internal power supply sources may be utilized to provide electric power when external power sources are not available.

Examples of internal power supply sources may comprise batteries and similar power storage/discharge systems. In this regard, such internal power supply sources may be configured to store power, and to subsequently discharge the stored power (when needed). For example, internal power supply sources may be charged when possible—e.g., when connectivity to external electric power sources is possible. The internal power supply sources may then discharge the stored power in a system comprising the internal power supply sources, such as when power is needed to drive components of the system. The process of charging the internal power supply sources and then discharging them (when needed) may be repeated (e.g., when the internal power supply sources are 'rechargeable').

The charging, recharging, and/or discharging of power supply storage/supply sources may pose some risks, however. For example, in batteries comprised of multiple cells, some cells may exhibit varying charging characteristics, and such variations in charging characteristics may cause some undesired effects. A cell that does not exhibit, for example, equivalent rise time characteristics as of the other cells assembled in a battery pack, may cause the battery pack not achieve its designed charge capacity, or it may cause the battery pack to be subjected to over-charge. In this regard, if the cell exhibits a slow rise time, the cell may fail to charge to the same level as the remaining cells in the pack; and if the cell exhibits a rapid rise time, the cell may charge faster than the remaining cells in the pack, thus posing the risk of over-charging. Therefore, it would be advantageous to have an apparatus and method for characterizing battery cells for use in battery packs which may be utilized in various systems, such as aircrafts.

Further limitations and disadvantages of conventional and traditional approaches will become apparent to one of skill in the art, through comparison of such systems with some aspects, as set forth in the remainder of the present application with reference to the drawings.

SUMMARY

An apparatus and/or method is provided for use of characterizing battery cells for use in battery packs, substantially as shown in and/or described in connection with at least one of the figures, as set forth more completely in the claims.

In one aspect, a method that may be used in characterizing battery cells may comprise determining charge characteristics for a plurality of rechargeable cells; classifying the plurality of rechargeable cells based on the determined charge characteristics; and combining in each multi-cell battery pack built, using the plurality of rechargeable cells, only cells with matching classification.

In another aspect, a system may be used in characterizing batteries, comprising one or more circuits, which may be operable to determine charge characteristics for a plurality of rechargeable cells; and classify the plurality of rechargeable cells based on the determined charge characteristics, to enable combining in each multi-cell battery built using the plurality of rechargeable cells only cells with matching classification.

In yet another aspect, a method may be used in monitoring charging of multi-cell battery packs, with each multi-cell battery pack comprising a plurality of rechargeable cells with similar charge and/or discharge profile. The method may comprise monitoring charging and/or discharging of each of the plurality of rechargeable cells in each multi-cell battery; and determining, based on the monitoring of charging and/or discharging, when one or more of the plurality of rechargeable cells deviate from the charge and/or discharge profile.

These and other advantages, aspects and novel features, as well as details of an illustrated embodiment thereof, will be more fully understood from the following description and drawings.

The features, functions, and advantages that have been discussed can be achieved independently in various embodiments or may be combined in yet other embodiments further details of which can be seen with reference to the following description and drawings.

DETAILED DESCRIPTION

Certain embodiments may be found in methods and systems for characterizing battery cells for use in battery packs. Many specific details of certain embodiments are set forth in the following description as well as the drawings to provide a thorough understanding of such embodiments. One skilled in the art, however, will understand that there may be additional embodiments, or that certain of these embodiments may be practiced without several of the details described in the following description. Like numbers refer to like elements throughout.

As utilized herein the terms "circuits" and "circuitry" refer to physical electronic components (i.e. hardware) and any software and/or firmware ("code") which may configure the hardware, be executed by the hardware, and or otherwise be associated with the hardware. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be performed by one or more circuits. As utilized herein, the term "exemplary" means serving as a non-limiting example, instance, or illustration. As utilized herein, the term "e.g.," introduces a list of one or more non-limiting examples, instances, or illustrations.

Figure 1:
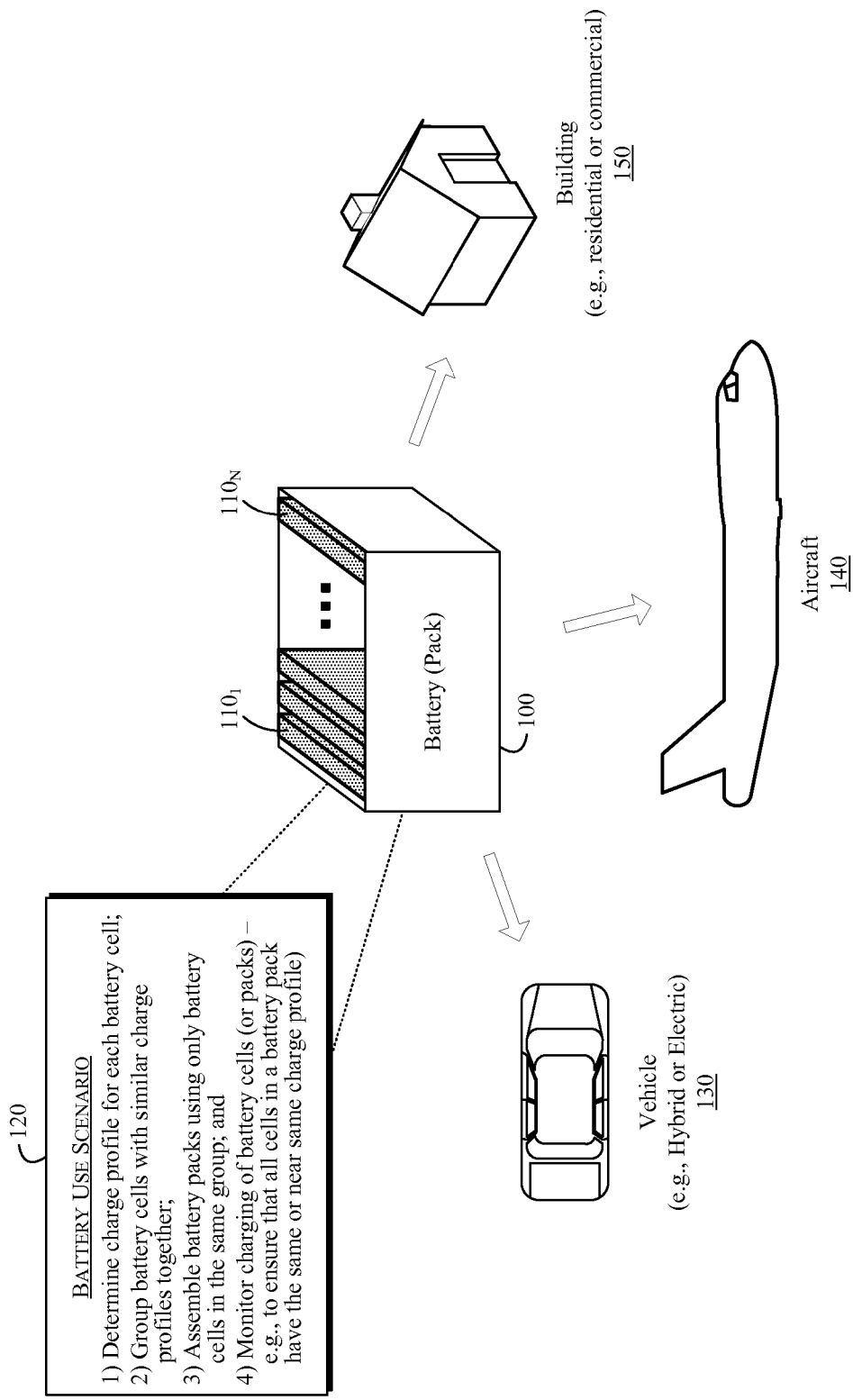
FIG. 1 illustrates an example system that utilizes batteries, which may be implemented using multiple battery cells.

FIG. 1 illustrates an example system that utilizes batteries, which may be implemented using multiple battery cells. Referring to FIG. 1, there is shown a battery 100.

The battery 100 may be operable to store and/or supply power. In this regard, the battery 100 may be configured to initially store power, and then subsequently providing, when needed, at least some of the stored power. The battery 100 may be utilized as power storage/supply component in various different types of systems or setups, such as vehicles 130, aircrafts 140, buildings 150 (e.g., residential or commercial), or the like. For example, the battery 100 may be utilized in aircrafts 140 in powering electric components therein; may be utilized in vehicles 130 to supply electric powertrain (e.g., in hybrid or electric vehicles); and may be utilized in buildings 150, as auxiliary power source (e.g., to supply power when there is power loss). The use of battery 100 is not limited, however, to any particular type of systems and/or setups, or to any particular use scenario; and it should be understood that the battery 100 may be utilized in substantially similar manner as described herein in any suitable system, setup, and/or scenario where power storage/supply may be required.

In some instances, the battery 100 may be implemented as a rechargeable based system—i.e. can be configured to draw and store power (and, if necessary, convert—e.g., AC to DC and vice versa). The stored power may be drawn from, for example, external power sources (e.g., power outlets and/or external auxiliary power devices)—i.e. external to the system/setup in which the battery 100 is installed, when it is possible to connect to these power sources (e.g., using suitable power cables). In some instances the power stored in the battery 100 may be drawn from sources in the system/setup in which the battery 100 is installed. For example, when the battery 100 is installed in the aircraft 140, the battery 100 may be charged before or during operations (e.g., flight) of the aircraft 140, such as using the compressors driven by air flow.

The power stored in the battery 100 may be outputted, such as via power connections (not shown), to various components of the system/setup in which the battery 100 is installed, to supply power that is required by these components during operations thereof (e.g., when no external power supply is available). For example, in the aircraft 140 the battery 100 may be utilized in starting engines (not shown), and/or powering instruments or avionics. Once power in the batteries is depleted (e.g., to a safe level), the battery 100 may be recharged, in the same manner—i.e., from external sources and/or internal sources in the system/setup in which the battery 100 is installed.

In some instances, the battery 100 may also comprise suitable circuitry, interfaces, logic and/or code for use in providing additional functions for supporting operations of the battery 100. For example, the battery 100 may comprise dedicated hardware and/or software components for monitoring parameters of the battery 100 (e.g., power level) and/or managing power operations in the battery, and/or for providing (feedback) information related thereto (e.g., to centralized control components in the system/setup in which the battery 100 is installed).

In various implementations, the battery 100 may be built based on multi-cell battery design. In this regard, the battery 100 may comprise a plurality of battery cells $110_1$-$110_N$, each of which may be operable to store (when charged or recharged) power, and may output stored power. The use of multi-cell battery (pack) design may be desirable because it may allow for flexibility in the design and/or building of batteries—e.g., allow for building or assembling batteries of different storage capabilities (e.g., voltage) using the same building blocks (standard battery cells). Thus, two different batteries may be built using battery cells with the same characteristics (e.g., charging), such as by using different number of battery cells.

Various technologies, designs and/or implementations may be used in building batteries (e.g., the battery 100) and/or battery cells (e.g., the battery cells $110_1$-$110_N$). For example, the battery 100 (or the cells $110_1$-$110_N$) may be implemented based on electrochemical rechargeable battery design, in which the charging (and recharging) may be achieved by storing electric power based on converting of applied electrical power (e.g., applied as current) into chemical energy, and the discharging (to output electric power) may be done based on converting of the stored chemical energy back into electrical power. In this regard, various chemicals may be utilized in battery or battery cells—e.g., as materials for the electrodes (the cathode and anode) and/or the electrolyte—to facilitate the required chemical interactions for the electric-chemical conversions. Examples of rechargeable batteries may comprise lithium-ion (Li-ion) batteries (including Li-ion polymer), lithium-sulfur (Li—S) batteries, lead-acid batteries, nickel cadmium (NiCd) batteries, nickel metal hydride (NiMH) batteries. For example, the battery cells $110_1$-$110_N$ may be implemented as lithium-ion (Li-ion) battery cells. In this regard, in lithium-ion (Li-ion) battery cells, the electrolyte may comprise lithium ions. The disclosure, however, is not limited to any particular type or design of rechargeable batteries.

The charging, recharging, and/or discharging of the battery 100 may pose some risks, however. For example, when the battery 100 is implemented as multi-battery cell battery (e.g., comprising the battery cells $110_1$-$110_N$), some of the battery cells may exhibit varying charging characteristics, and such variations in charging characteristics may cause some undesired effects. In this regard, where a battery cell $110_i$ (e.g., the battery cell $110_1$) that does not exhibit, for example, equivalent (or sufficiently similar) charge rise time characteristics as of the other battery cells in the battery 100, that battery cell may not achieve its designed charge capacity. For example, if the battery cell $110_i$ exhibits a slow rise time, the battery cell $110_i$ may fail to charge to the same level as the remaining battery cells in the pack, and/or the remaining cells in the battery may receive an over-charge (e.g., if the overall battery voltage is the determinative factor in ending charging of the battery pack, since the overall battery pack voltage would be lower than desired value, due to the slow rise time, thus resulting in the charging source/system continuing to charge the battery to try to raise the battery voltage to the desired level). On the other hand, if the battery cell $110_i$ exhibits a rapid rise time, the battery cell $110_i$ may charge faster than the remaining battery cells in the pack, thus posing the risk of over-charging battery cell $110_i$. Such deviations may be particularly concerning with certain types of battery cells. For example, in the case of Li-ion batteries, over-charging may result in internal battery cell thermal runaway, which may in turn result in battery run away.

Accordingly, in various implementations in accordance with the present disclosure, enhanced characterization techniques may be utilized to ensure that only battery cells with sufficiently equivalent charging/recharging/discharging profiles are combined in battery packs. In this regard, characterization of battery cells may be done based on, for example, determining of certain battery cell parameters related to the battery cell, such as the internal resistance and/or the internal capacitance of the battery cell. Once these parameters are determined, an algorithm is then used to correlate these battery cell parameters as a means of characterization. The algorithm results may then be used to compare battery cells against each other. In this regard, when comparing the battery cells, a minimum degree of similarity may be used when determined when two battery cells are equivalent with respect to particular charge/discharge characteristics. In other words, when determining when battery cells are equivalent with respect to particular charge/discharge characteristics, the comparison between corresponding parameters (e.g., as generated by the algorithm with respect to each battery cell) may allow for certain degree of variation. The degree of similarity (or variation) in each charging or discharging characteristic may be determined based on different factors, such as battery cell type for example. For example, charge/discharge characteristics of Li-ion battery cells that are in the same battery/pack may need to be identical, because of the particularly high risks that may result in certain situations (e.g., internal battery cell thermal runaway resulting from over-charging).

In an example implementation, a fast, in-line manufacturing technique which uses the actual performance of the battery cell may be utilized to provide an accurate representation of the characteristics of the battery cell. For example, the characterization may be done based on determination of a battery cell's rise time curve. In this regard, the battery cell's rise time curve may be determined and/or captured by software while the battery cell is charged during in-line test, or the rise time may be captured by dedicated measuring means (e.g., hardware attached to the charging circuit), to enable plotting the rise time. Accordingly, by capturing the rise time of the cell under current based charge, the internal resistance and capacitance (as well as all other parameters of the battery cell) may be inherently captured. The cells may then be marked based on the captured rise curve, and cells having the same (or near same) rise time curves can be considered as usable within the same battery packs.

In an example use scenario 120, charge profile for each of a plurality of battery cells may be determined, such as based on cells' voltage rise curves. Battery cells with the same or near same charge profile may then be grouped. In this regard, the allowed degree of variation may differ (e.g., based on the type of battery cell), with some battery cell types requiring virtual identical match charge profiles for members of the same group. The battery packs (e.g., battery 100) may then be assembled using only battery cells in the same group, to ensure same (or near same) charging characteristics. Charging of battery packs (and/or individual cells) may then be marked, and compared against originally determined charge profiles, such as to ensure that all cells in a battery pack maintain the same or near same charge profile. Further examples and/or details are provided in the following figures.

Figure 2:
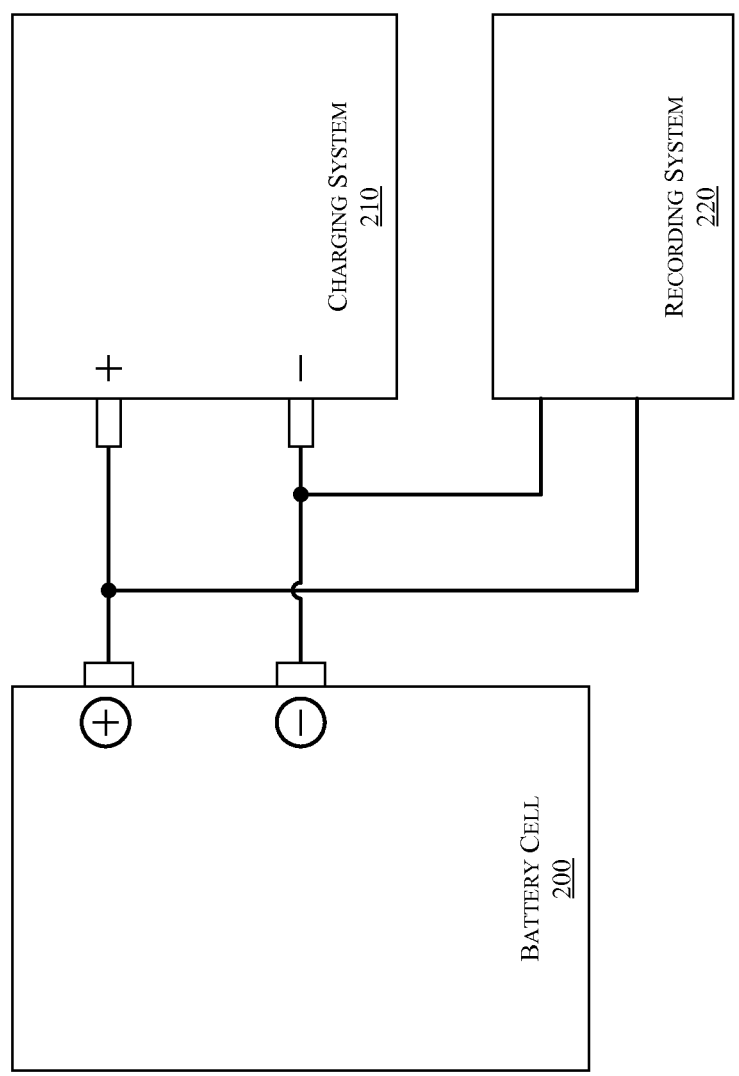
FIG. 2 illustrates an example setup for manually characterizing charging profiles of battery cells.

FIG. 2 illustrates an example setup for manually characterizing charging profiles of battery cells. Referring to FIG. 2, there is shown a battery cell 200, a charging system 210, and a monitoring system 220.

The battery cell 200 may comprise a rechargeable electric power storage device, which may be utilized to store (electric) power and then discharging the stored power (when needed). The battery cell 200 may comprise, for example, an electrochemical rechargeable cell. For example, the battery cell 200 may comprise lithium-ion (Li-ion) cell. The disclosure is not limited, however, to particular type of battery cells. The battery cell 200 may be used in assembly of battery packs—i.e., multiple battery cells 200 may be assembled into a single battery pack (e.g., the battery 100 of FIG. 1).

The charging system 210 may comprise suitable components (e.g., mechanical, electrical, hardware, software, or the like) for charging battery cells, such as the battery cell 200. For example, the charging system 210 may be configured to apply constant current, which when connected to the electrodes of the battery cell 200 may result in charging the cell, by causing chemical conversion therein resulting in storage of the applied electric energy.

The monitoring system 220 may comprise suitable circuitry, interfaces, logic and/or code for monitoring charging of battery cells, such as the battery cell 200. For example, the monitoring system 220 may be configured to capture particular parameters or characteristics of the battery cell 200, such as voltage for example, which may be indicative of the charging/storage status of the cell.

In operation, the charging characteristics of the battery cell 200 may be determined manually, using the monitoring system 220 for example, such as during in-line test (e.g., as part of the battery cell manufacturing process). For example, the charging of the battery cell 200 may be initiated by applying, by the charging system 210, constant current. During the charging of the battery cell 200, cell voltage may be sampled and/or recorded (e.g., by the monitoring system 220, such as by measuring the voltage between the electrodes), at a rate that may be determined sufficient to capture the voltage rise curve. In this regard, the rise curve may be deemed sufficient to represent the cell charge characteristics, and as such may be used for comparing and/or matching cells—e.g., for incorporating in the battery packs. Once complete (or sufficient) information regarding the cell's voltage rise curve is obtained, the cell may be marked in manner that may enable correlating the cell to its voltage rise curve. When assembling a battery pack (e.g., the battery 100 of FIG. 1), a plurality of battery cells may be classified, categorized and/or groups based on their rise curves (e.g., using the marking), and only battery cells with the same marking, indicating the same or near same (e.g., similarity within acceptable variation ranges) charge characteristics may be incorporated into each battery pack. This should allow for elimination or mitigating variations in per-cell charge/discharge during operation of the battery packs. The degree or amount of acceptable variations in the charge/discharge characteristics may be determined and/or defined based on, for example, such battery pack (or cell) related attributes as type, design, structure and/or composition. For example, in particular types of battery packs or cells, such as Li-ion battery packs/cells, the charge/discharge may have to be identical for the battery packs or cells to be considered in the same group (i.e. "in-family") due to the particular risks (e.g., ignition) that may be posed by variations in charge/discharge performance.

Figure 3:
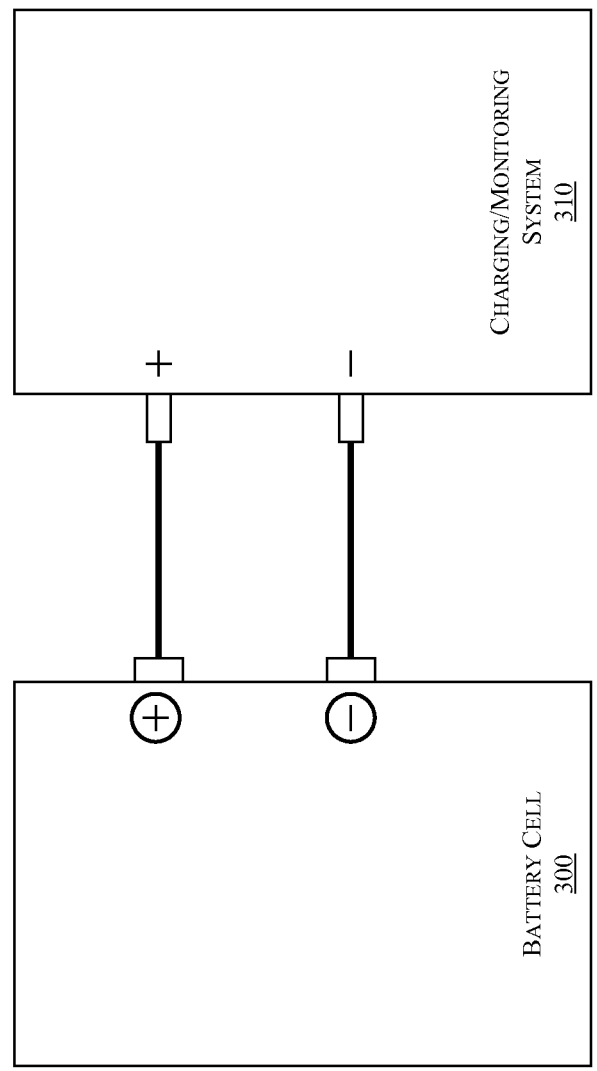
FIG. 3 illustrates an example setup for automatically characterizing charging profiles of battery cells.

FIG. 3 illustrates an example setup for automatically characterizing charging profiles of battery cells. Referring to FIG. 3, there is shown a battery cell 300, and a charging and monitoring system 310.

The battery cell 300 may be similar to the battery cell 200, substantially as described with respect to FIG. 2. In this regard, the battery cell 300 may comprise an electrochemical rechargeable cell, such as a lithium-ion (Li-ion) cell. As with the battery cell 200, the battery cell 300 may also be used in assembly of battery packs—i.e., multiple battery cells 200 may be assembled into a single battery pack (e.g., the battery 100 of FIG. 1).

The charging and monitoring system 310 may be similar to the charging system 210, substantially as described with respect to FIG. 2. In this regard, the charging and monitoring system 310 may be utilized in charging battery cells (e.g., the battery cell 300), such as by applying constant current for example. The charging and monitoring system 310 may also comprise suitable circuitry, interfaces, logic and/or code for monitoring charging of battery cells, such as the battery cell 300. In this regard, when performing the monitoring function (which may be done while also performing the charging function), the charging and monitoring system 310 may be configured to capture particular parameters or characteristics of the battery cell 300, such as voltage for example, which may be indicative of the charging/storage status of the cell.

In operation, the charging characteristics of the battery cell 300 may be determined automatically (e.g., using the charging and monitoring system 310 itself for example), such as during in-line test (i.e. as part of the battery cell manufacturing process). In this regard, the charging and monitoring system 310 may incorporate monitoring related components (e.g., voltage measuring hardware components, and/or software and/or firmware for running and/or performing monitoring related applications or functions), and/or may be configured to perform the monitoring (e.g., using the monitoring related components) of the charging such that to allow determining or generating charging characteristics related information in instantaneous (or near instantaneous) manner. For example, the charging of the battery cell 300 may be initiated by applying, by the charging and monitoring system 310, constant current. During the charging of the battery cell 300, voltage may be sampled and/or recorded (e.g., by the charging and monitoring system 310 or monitoring components thereof, such as by measuring the voltage between the electrodes), at a rate that may be determined sufficient to capture the voltage rise curve. In this regard, the rise curve may be deemed sufficient to represent the cell charge characteristics, and as such may be used for comparing and/or matching cells—e.g., for incorporating in the battery packs. Once complete (or sufficient) information regarding cell's voltage rise curve is obtained, the cell may be marked in manner that may enable correlating the cell to its voltage rise curve. When assembling a battery pack (e.g., the battery 100 of FIG. 1), a plurality of battery cells may be classified, categorized and/or grouped based on their rise curves (e.g., using the marking), and only battery cells with the same marking, indicating the same or near same (e.g., acceptable similarity) charge characteristics may be incorporated into each battery pack. This should allow for elimination and/or mitigating of variations in per-cell charge/discharge during operation of the battery packs.

Figure 4:
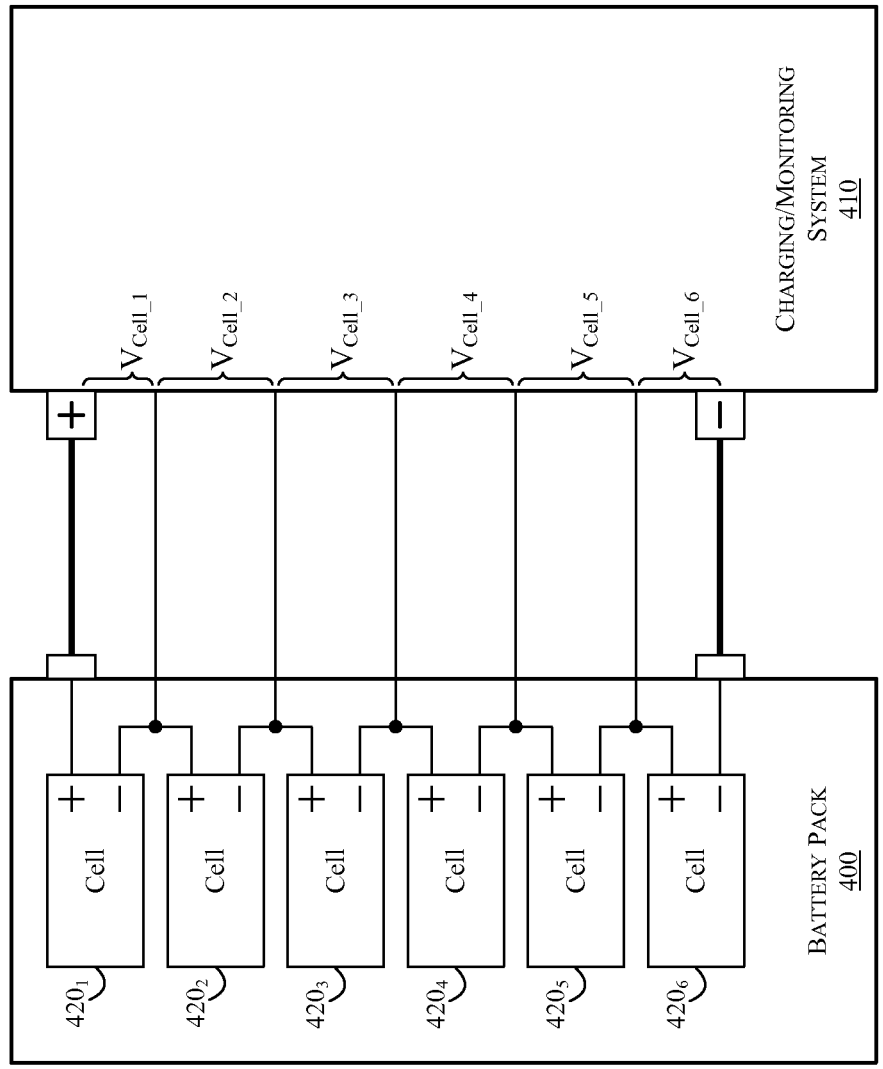
FIG. 4 illustrates an example setup for monitoring charging characteristics of battery cells in a multi-cell battery.

FIG. 4 illustrates an example setup for monitoring charging characteristics of battery cells in a multi-cell battery. Referring to FIG. 4, there is shown a battery pack 400 and a charging and monitoring system 410.

The battery pack 400 may comprise a multi-cell electric power storage device, which may be utilized to store (electric) power and then discharging the stored power (when needed). The battery pack 400 may be configured as rechargeable system—i.e. allowing for recharging of battery pack 400 after stored power is depleted (e.g., to a safe level). The battery pack 400 may comprise, for example, a plurality of electrochemical rechargeable cells $420_1$-$420_N$. For example, as shown in FIG. 4, the battery pack 400 may contain six rechargeable cells $420_1$-$420_6$. The disclosure, however, is not limited to particular number of cells in the battery pack. Each rechargeable cell $420_i$ may be similar to the rechargeable cell 200 of FIG. 2. In some instances, it may be necessary to ensure that all cells $420_i$ in the battery pack 400 have similar (or identical) charging and/or discharging characteristics (i.e. "in-family" charging and/or discharging profile), such as to prevent issues (e.g., ignition) that may arise from and/or relate to variations in charging/discharging performance of the cells $420_i$.

The charging and monitoring system 410 may comprise suitable components (e.g., mechanical, electrical, hardware, software, or the like) for enabling charging of battery packs (e.g., the battery pack 400), such as by applying constant current. The charging and monitoring system 410 may also comprise suitable circuitry, interfaces, logic and/or code for monitoring charging and/or discharging of battery packs, such as the battery pack 400. In this regard, when performing the monitoring function (which may be done while also performing the charging function and/or while the battery pack 400 is discharging—e.g., to output required power), the charging and monitoring system 410 may be configured to capture particular charging and/or discharging related parameters or characteristics of the battery pack 400, such as voltage for example, which may be indicative of the charging/storage and/or discharging status of monitored battery packs. In some instances, the charging and monitoring system 410 may be configured to capture particular parameters or characteristics of individual cells within battery packs. For example, when charging and monitoring the battery pack 400, the charging and monitoring system 410 may be operable to capture or record per-cell voltage associated with each of the battery cells $420_1$-$420_6$. In this regard, each of the per-cell voltages $V_{cell\_1}$-$V_{cell\_6}$ may be indicative of the charging/storage status of the corresponding cell.

In operation, the charging and monitoring system 410 may be utilized in charging the battery pack 400. In this regard, the charging and monitoring system 410 may be utilized to apply constant current into the battery pack 400, such as in manner that may result in charging of each of the battery cells $420_1$-$420_6$ included therein. The charging and monitoring system 410 may also be utilized in determining the charging (or discharging) characteristics of the battery pack 400. In this regard, the charging and monitoring system 410 may be configured to determine the charging or discharging characteristics automatically—e.g., using the charging and monitoring system 410 itself, such as using monitoring components (e.g., hardware, software and/or firmware). For example, the charging and monitoring system 410 may be utilized in determining the charging or discharging characteristics of the battery pack during in-line test (i.e. as part of the battery pack manufacturing process. In some instances, however, the charging and monitoring system 410 may also be utilized in conjunction with use of the battery pack 400. For example, the charging and monitoring system 410 may be incorporated into a system comprising the battery pack 400 (e.g., the aircraft 140 of FIG. 1), or may be implemented as dedicated charging/monitoring apparatus that may be used in recharging the battery pack 400 and/or providing dynamic monitoring of charging/discharging characteristics related thereto.

In an example use scenario, the charging and monitoring system 410 may be used, once charging process of the battery pack 400 began, to sample and/or record voltage. In this regard, the charging and monitoring system 410 may sample and/or record voltage associated with each of the battery cells $420_1$-$420_6$ in the battery pack 400 (i.e., determining or measuring each of the per-cell voltages $V_{cell\_1}$-$V_{cell\_6}$). The charging and monitoring system 410 may be configured to perform the sampling or recording at such a rate that may be determined sufficient to capture the voltage rise curve for each of the battery cells $420_1$-$420_6$. In this regard, the rise curve may be deemed sufficient to represents the cell charge characteristics, and as such may be used for comparing and/or matching cells—e.g., for incorporating in the battery packs. Once complete (or sufficient) information regarding the voltage rise curves, for all of the battery cells $420_1$-$420_6$, has been determined, the voltage rise curves may be utilized in comparing cells. In this regard, the voltage rise curves may be determined whether the cell match—i.e., whether they have identical (or near identical) charge characteristics.

The charging and monitoring system 410 may be utilized in substantially similar manner to determine per-cell discharging characteristics. For example, the charging and monitoring system 410 may be configured to sample or record per-cell voltage, at (what may be determined to be) sufficient rate, to capture the voltage fall curve for each of the battery cells $420_1$-$420_6$. In this regard, the voltage fall curves may represent or corresponding to the cell discharge characteristics, and as such may be used to comparing and/or matching cells.

When one or more cells in the battery pack 400 (e.g., battery cells $420_2$ and $420_5$ in the battery pack 400) are determined to not match what had been determined to be the cell "in-family" voltage rise curve and/or voltage fall curve (i.e. "out-of-family"), the cells may be marked as such. The battery cell(s) marked as being mismatch with the remaining cells in the same battery pack may then be handled accordingly. In this regard, battery cells marked as "out-of-family" may be identified for replacement (when possible). Furthermore, use of the battery pack may be adjusted based on identification of such "out-of-family" battery cells. For example, battery cells identified as "out-of-family" may be bypassed during use of the battery pack (e.g., battery pack 400 may be configured to only utilize battery cells $420_1$, $420_3$, $420_4$ and $420_6$, and bypass battery cells $420_2$ and $420_5$ that had been identified as "out-of-family"). In this regard, such bypassing may only be done when it is determined that the remaining battery cells are sufficient to provide the required voltage needed by the system comprising the battery pack. In instances where the bypassing is not possible (e.g., the battery pack is not configured to provide such bypassing, or remaining cells are inadequate), the charging (or discharging) of the battery pack may be discontinued.

Figure 5:
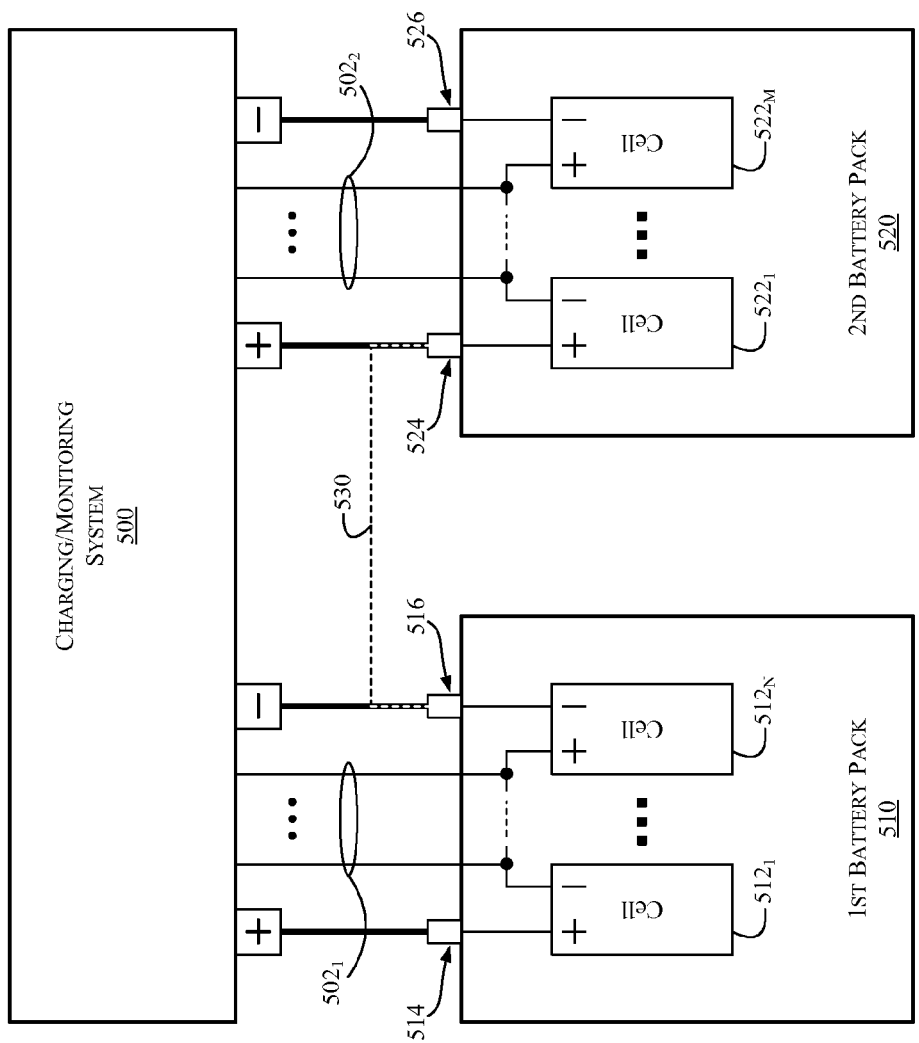
FIG. 5 illustrates an example setup for monitoring charging characteristics of battery cells in multiple multi-cell batteries.

FIG. 5 illustrates an example setup for monitoring charging characteristics of battery cells in multiple multi-cell batteries. Referring to FIG. 5, there is shown a charging and monitoring system 500, and a pair of multi-cell battery packs 510 and 520.

The battery packs 510 and 520 may be substantially similar to the battery pack 400 of FIG. 4. In this regard, as with the battery pack 400, each of the battery packs 510 and 520 may be charged (thus storing electric power), and subsequently may discharge the stored power to a safe level (when needed). Furthermore, the battery packs 510 and 520, as with the battery pack 400, may be configured as rechargeable systems—i.e. allowing for recharging after stored power is depleted to a safe level. As with the battery pack 400, the battery packs 510 and 520 may be designed or built as multi-cell battery packs. In this regard, each of the battery packs 510 and 520 may comprise a plurality of rechargeable battery cells, $512_1$-$512_N$ and $522_1$-$522_M$, respectively. Each of the rechargeable cell battery cells, $512_1$-$512_N$ and $522_1$-$522_M$ may be similar to the rechargeable cell 200 of FIG. 2. In this regard, the battery cells may be selected such as cells in each battery may have similar (or even identical) charging characteristics—i.e., each of the battery cells $512_1$-$512_N$ of the battery pack 510 have similar (or identical) charge profiles, and also each of the battery cells $522_1$-$522_M$ have similar (or identical) charge profiles. Furthermore, in some instances, the battery cells in both packs (each of the battery cells $512_1$-$512_N$ and $522_1$-$522_M$) may have similar (or identical) charge profiles. This may be the case in situations where although two battery packs are used, they actually function (and are utilized) as a single battery pack, thus requiring that all battery cells (in both battery packs) have the same in-family characteristics. The number of battery cells in each of the battery packs 510 and 520 may be different (thus have N vs. M cells), to allow for different operation characteristics (e.g., different maximum charging—e.g., battery voltage—characteristics).

The charging and monitoring system 500 may be substantially similar to the charging and monitoring system 410 of FIG. 4. In this regard, the charging and monitoring system 500 may comprise suitable components (e.g., mechanical, electrical, hardware, software, or the like) for enabling charging of battery packs, and may also comprise suitable circuitry, interfaces, logic and/or code for monitoring charging and/or discharging of battery packs. Furthermore, the charging and monitoring system 500 may be particularly configured for charging and/or monitoring multiple battery packs, and to do simultaneously.

For example, with respect to the charging function, the charging and monitoring system 500 may be configured to allow charging concurrently multiple battery packs (e.g., the battery packs 510 and 520), such as separately or in-series. In this regard, the charging and monitoring system 500 may be adapted to separately charge each of multiple battery packs, such as by using multiple charging connectors (as shown in FIG. 5). The charging and monitoring system 500 may be adapted to separately charge each of multiple battery packs in series, such as by connecting the charging connectors of the charging and monitoring system 500 to a first electrode (e.g. cathode) of a first-in-series battery pack and to a second electrode (e.g. anode) of last-in-series battery pack, with connectors between the battery packs (similar to the manner by which cells within multi-cell are connected) to complete the charging circuit. For example, in an in-series use scenario, the charging and monitoring system 500 may be connected, to charge the combination of the battery packs 510 and 520, to the anode 514 of a battery pack 510 and to the cathode 526 of the battery pack 520, with connector 530 being used to connect between the cathode 516 of a battery pack 510 and the anode 524 of the battery pack 520, to complete the charging circuit. Accordingly, the charging and monitoring system 500 may essentially handle the combination of the battery packs 510 and 520 as if it was a 'single' battery pack, comprising N+M cells (battery cells $512_1$-$512_N$ and $522_1$-$522_M$), substantially as described with respect to FIG. 4 for example.

When performing the monitoring function (which may be done while also performing the charging function, and/or during discharging the battery packs 510 and/or 520—e.g., to output required power), the charging and monitoring system 500 may be configured to capture particular charging and/or discharging related parameters or characteristics of the battery packs, such as voltage for example, which may be indicative of the charging/storage and/or discharging status of monitored battery packs. Furthermore, the charging and monitoring system 500 may be configured to capture particular parameters or characteristics of individual cells within battery packs. For example, the charging and monitoring system 500 may be operable to capture or record per-cell voltage associated with each of the battery cells $512_1$-$512_N$ (of the battery pack 510) and $522_1$-$522_M$ (of the battery pack 520). In this regard, separate sets of monitoring connections (shown as connector sets $502_1$ and $502_2$), which may be configured such as each of the per-cell voltages ($V_{cell\_1,1}$-$V_{cell\_1,N}$, corresponding to battery cells $512_1$-$512_N$; and $V_{cell\_2,1}$-$V_{cell\_2,M}$, corresponding to battery cells $522_1$-$522_M$) may be measured (individually), for use as indication of the charging/storage status of the corresponding cell, substantially in the same manner as described with respect to FIG. 4. In in-series use scenarios, the monitoring performed by the charging and monitoring system 500 may be configured such that the system may handle the combination of the battery packs 510 and 520 as if it was a 'single' battery pack, comprising N+M cells (battery cells $512_1$-$512_N$ and $522_1$-$522_M$)—i.e. monitor all these cells to ensure that they all comply with a single "in-family" profile.

In operation, the charging and monitoring system 500 may be utilized in charging the battery packs 510 and 520, substantially in similar manner as described with respect to the charging and monitoring system 410 and the battery pack 400 of FIG. 4. The charging performed by the charging and monitoring system 500 may, however, be adapted to accommodate charging multiple battery packs, and to do so concurrently. The charging and monitoring system 500 may also be utilized in monitoring charging/discharging of the battery packs 510 and 520—e.g., measuring, obtaining, and/or compiling data pertaining to charging (or discharging) characteristics of the battery packs 510 and 520, substantially in similar manner as described with respect to the charging and monitoring system 410 of FIG. 4. In this regard, the charging and monitoring system 500 may be utilized in determining the charging or discharging characteristics of the battery pack during in-line test (e.g., as part of the manufacturing/assembling process) and/or in conjunction with use of the battery packs. For example, the charging and monitoring system 500 may be incorporated into a system comprising the battery packs 510 and 520 (e.g., the aircraft 140 of FIG. 1), or may be implemented as dedicated charging/monitoring apparatus that may be used in recharging the battery packs 510 and 520, and/or providing dynamic monitoring of charging/discharging characteristics related thereto.

In an example use scenario, the charging and monitoring system 500 may be used, once charging process of the battery packs 510 and 520 began, to sample and/or record voltage. In this regard, the charging and monitoring system 500 may sample and/or record voltage associated with each of the battery cells $512_1$-$512_N$ and $522_1$-$522_M$ in the battery packs 510 and 520 (i.e., determining or measuring each of the per-cell voltages $V_{cell\_1,1}$-$V_{cell\_1,N}$ and $V_{cell\_2,1}$-$V_{cell\_2,M}$). The charging and monitoring system 500 may be configured to perform the sampling or recording at such a rate that may be determined sufficient to capture the voltage rise curve for each of the battery cells $512_1$-$512_N$ and $522_1$-$522_M$. In this regard, the rise curve may be deemed sufficient to represent the cell charge characteristics, and as such may be used to comparing and/or matching cells—e.g., for incorporating in the battery packs. Once the charging is complete and the voltage rise curves, for all of the battery cells $512_1$-$512_N$ and $522_1$-$522_M$, are determined, the voltage rise curves may be utilized in comparing cells. In this regard, the voltage rise curves may be used to determine whether the cells match—i.e., whether they have identical (or near identical) charge characteristics.

The charging and monitoring system 500 may be utilized in substantially similar manner to determine per-cell discharging characteristics. For example, the charging and monitoring system 500 may be configured to sample or record per-cell voltage, at (what may be determined to be) sufficient rate, to capture the voltage fall curve for each of the battery cells $512_1$-$512_N$ and $522_1$-$522_M$. In this regard, the voltage fall curves may represent or correspond to the cell discharge characteristics, and as such may be used to compare and/or match cells.

When one or more cells in the battery packs 510 and 520 are determined to not match what had been determined to be the cell "in-family" voltage rise curve and/or voltage fall curve (i.e. "out-of-family"), the cells may be marked as such. In this regard, the "in-family" to which the cells of each of battery packs 510 and 520 (i.e., the "in-family" of the battery cells $512_1$-$512_N$ vs. the "in-family" of the battery cells $522_1$-$522_M$) may be the same. The "out-of-family" battery cells and/or battery packs may then be handled in substantially similar manner as described with respect to FIG. 4.

Figure 6:
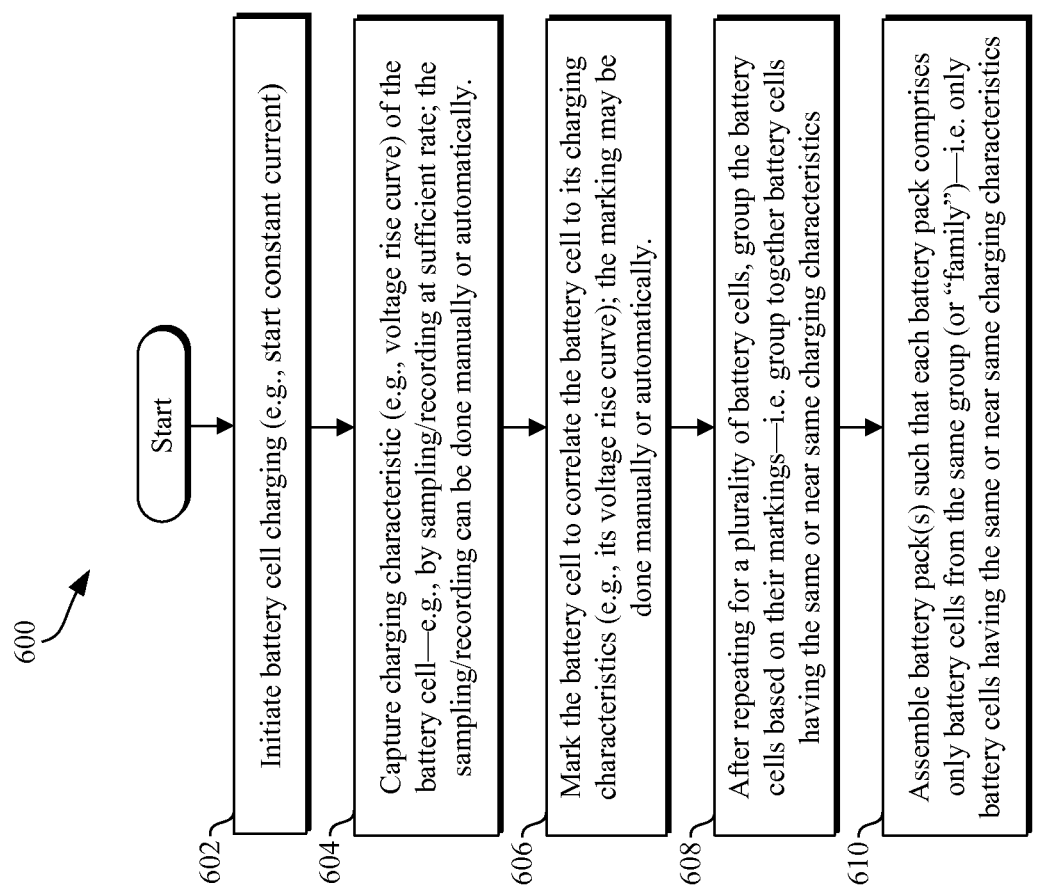
FIG. 6 is a flow chart that illustrates an example process for characterizing charging profiles of battery cells.

FIG. 6 is a flow chart that illustrates an example process for characterizing charging profiles of battery cells. Referring to FIG. 6, there is shown a flow chart 600, comprising a plurality of example steps.

In step 602, battery cell charging may be initiated—e.g., by starting constant current, which may be applied by a charging system (e.g., the charging system 210 or 310). In step 604, charging characteristic (e.g., voltage rise curve) of the battery cell may be captured. For example, the voltage rise curve may be captured by sampling and/or recording voltage at sufficient rate. In this regard, the sampling and/or recording can be done manually or automatically. In step 606, the battery cell may be marked in a manner that may enable correlating the battery cell to its charging characteristics (e.g., to its voltage rise curve). The marking may be done manually or automatically.

In step 608, after repeating the charging/capturing/marking steps (i.e. step 602-606) for a plurality of battery cells, the battery cells may be grouped based on their markings—i.e. group together battery cells having the same or near same charging characteristics. In some instances, however, it may be necessary to only group together (in the same "in-family") battery cells that have virtually identical charging characteristics. This may be particularly the case in situations where differences in charging performance (e.g. resulting in overcharging) may pose significant risks or dangers (e.g., with Li-ion cells, which may ignite if overcharged). In step 610, battery pack(s) may be assembled using the marked and grouped battery cells, such that each battery pack would only contain battery cells from the same group (or "in-family")—i.e., only battery cells having the same or near same charging characteristics. Furthermore, the assembled battery packs may be marked based upon their battery cells' characteristics to facilitate the use of series "in-family" battery packs.

Figure 7:
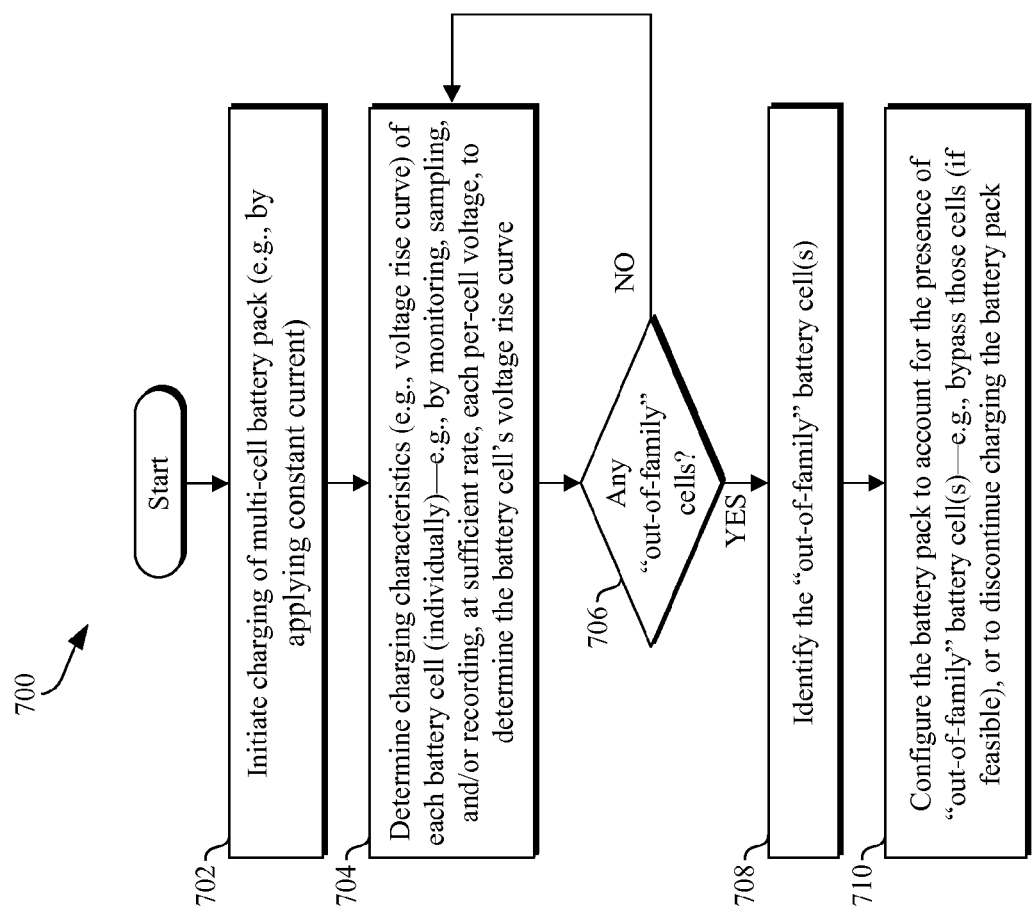
FIG. 7 is a flow chart that illustrates an example process for monitoring charging characteristics of battery cells in a multi-cell battery.

FIG. 7 is a flow chart that illustrates an example process for monitoring charging characteristics of battery cells in a multi-cell battery. Referring to FIG. 7, there is shown a flow chart 700, comprising a plurality of example steps.

In step 702, charging of a multi-cell battery pack may be initiated—e.g., by applying constant current, such as by a charging system, such as the charging and monitoring system 410. In step 704, charging characteristics of each cell (individually) may be determined. For example, the battery cell charging may be characterized based on each cell voltage (e.g. voltage rise curve), which may be determined (captured) by monitoring, sampling, and/or recording, at sufficient rate, each per-cell voltage ($V_{Cell\_i}$), to determine the cell voltage rise curve. In step 706, it may be determined whether any battery cell in the multi-cell battery pack is "out-of-family"—i.e., has charging characteristics that may deviate or differ from what is selected as (or known to be) the charging characteristic of the group (i.e. the "in-family") to which the battery cells belong. In instances where it is determine that the there are no "out-of-family" cells, the process may loop back to step 704, to continue monitoring the cells (or, alternatively, the process may terminate if the charging of the multi-cell battery pack was completed).

Returning to step 706, in instances where it is determine that there may be "out-of-family" battery cell(s), the process may proceed to step 708. In step 708, the discovered "out-of-family" battery cell(s) may be identified for replacement (when replacing individual battery cells is possible). In step 710, the multi-cell battery pack may be configured to account for the presence of "out-of-family" battery cell(s). For example, the multi-cell battery pack may be configured to bypass those cells, if that is feasible (e.g., if the multi-cell battery pack was designed to allow for bypassing individual battery cells, and (if that's the case) if remaining "in-family" cells are sufficient to perform the required functions of the battery pack). Alternatively, charging (and/or use) of the multi-cell battery pack may simply be discontinued.

Other embodiments may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for characterizing battery cells for use in battery packs.

Accordingly, the presently disclosed embodiments may be realized in hardware, software, or a combination of hardware and software. The present embodiments may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein.

The presently disclosed embodiments may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While described with reference to certain embodiments, it will be understood by those skilled in the art that various changes may be made and equivalents may be substituted without departing from the scope of the presently described embodiments. In addition, many modifications may be made to adapt a particular situation or material to the teachings without departing from its scope. Therefore, it is intended that the presently disclosed embodiments not be limited to the particular embodiment disclosed, but rather will include all embodiments falling within the scope of the appended claims.

What is claimed is:

1. A method, comprising:
   determining voltage charge characteristics for a plurality of rechargeable cells;
   classifying the plurality of rechargeable cells based on the determined voltage charge characteristics, wherein the voltage charge characteristics are determined during charging or recharging;
   combining in each multi-cell battery built using the plurality of rechargeable cells, only cells with matching classification; and
   by-passing one or more of the plurality of rechargeable cells determined to deviate from a charge profile and/or a discharge profile.

2. The method of claim 1, wherein the plurality of rechargeable cells comprise lithium-ion (Li-ion) cells.

3. The method of claim 1, comprising classifying the plurality of rechargeable cells manually or automatically.

4. The method of claim 1, comprising classifying the plurality of rechargeable cells based on having identical one or more of the voltage charge characteristics.

5. The method of claim 1, comprising allowing for predefined variation in one or more of the voltage charge characteristics when classifying the plurality of rechargeable cells based on the voltage charge characteristics.

6. The method of claim 1, comprising determining based on cell type, when classifying the plurality of rechargeable cells based on the voltage charge characteristics, whether to require identical matching or acceptable variation.

7. The method of claim 1, wherein the voltage charge characteristics comprise a voltage change during charging or recharging of a corresponding rechargeable cell.

8. The method of claim 7, comprising determining the voltage rise curve by sampling or recording cell voltage at a predefined rate.

9. The method of claim 7, comprising classifying the plurality of rechargeable cells based on having identical voltage rise curve.

10. A system, comprising:
    one or more circuits for use in an electronic device, the one or more circuits being operable to:

determine voltage charge characteristics for a plurality of rechargeable cells;

classify the plurality of rechargeable cells based on the determined voltage charge characteristics, to enable combining in each multi-cell battery built using the plurality of rechargeable cells only cells with matching classification, wherein the voltage charge characteristics are determined during charging or recharging; and by-pass one or more of the plurality of rechargeable cells determined to deviate from a charge profile and/or a discharge profile.

11. The system of claim 10, wherein the plurality of rechargeable cells comprise lithium-ion (Li-ion) cells.

12. The system of claim 10, wherein the one or more circuits are operable to classify the plurality of rechargeable cells based on having identical one or more of the voltage charge characteristics.

13. The system of claim 10, wherein the one or more circuits are operable to allow for predefined variation in one or more of the voltage charge characteristics when classifying the plurality of rechargeable cells based on the voltage charge characteristics.

14. The system of claim 10, wherein the one or more circuits are operable to determine based on cell type, when classifying the plurality of rechargeable cells based on the voltage charge characteristics, whether to require identical matching or acceptable variation.

15. The system of claim 10, wherein the voltage charge characteristics comprise a voltage change during charging or recharging of a corresponding rechargeable cell.

16. The system of claim 15, wherein the one or more circuits are operable to classify the plurality of rechargeable cells based on having identical voltage rise curve.

17. The system of claim 15, wherein the one or more circuits are operable to determine the voltage rise curve based on sampling or recording cell voltage at a predefined rate.

18. A method, comprising:
in a multi-cell battery that comprises a plurality of rechargeable cells with similar charge profile and/or discharge profile:
monitoring charging and/or discharging of each of the plurality of rechargeable cells;
determining, based on the monitoring of charging and/or discharging, when one or more of the plurality of rechargeable cells deviate from the charge profile and/or discharge profile; and
by-passing one or more of the plurality of rechargeable cells determined to deviate from the charge profile and/or the discharge profile.

19. The method of claim 18, comprising monitoring the charging and/or discharging of each of the plurality of rechargeable cells based on determining of voltage rise or fall rate for corresponding cell.

* * * * *